United States Patent
Komatsu et al.

(10) Patent No.: US 9,538,694 B2
(45) Date of Patent: Jan. 3, 2017

(54) METHOD OF PRODUCING A LIQUID-CRYSTALLINE POLYMER COMPOSITION AND MOLDED ARTICLE THEREOF

(71) Applicant: SUMITOMO CHEMICAL COMPANY, LIMITED, Tokyo (JP)

(72) Inventors: Shintaro Komatsu, Tsukuba (JP); Hiroshi Harada, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 163 days.

(21) Appl. No.: 14/262,849

(22) Filed: Apr. 28, 2014

(65) Prior Publication Data

US 2014/0231714 A1 Aug. 21, 2014

Related U.S. Application Data

(63) Continuation of application No. 13/071,919, filed on Mar. 25, 2011, now abandoned.

(30) Foreign Application Priority Data

Mar. 31, 2010 (JP) ................. 2010-081655

(51) Int. Cl.

| | |
|---|---|
| C08L 67/00 | (2006.01) |
| H05K 9/00 | (2006.01) |
| B29C 70/58 | (2006.01) |
| B29C 70/88 | (2006.01) |
| C08J 3/20 | (2006.01) |
| C08K 3/08 | (2006.01) |
| C08K 3/36 | (2006.01) |
| C08K 9/02 | (2006.01) |
| C09K 19/38 | (2006.01) |
| C08L 67/03 | (2006.01) |
| B29C 70/02 | (2006.01) |

(52) U.S. Cl.
CPC ............ *H05K 9/0081* (2013.01); *B29C 70/58* (2013.01); *B29C 70/882* (2013.01); *C08J 3/203* (2013.01); *C08K 3/08* (2013.01); *C08K 3/36* (2013.01); *C08K 9/02* (2013.01); *C08L 67/03* (2013.01); *C09K 19/3809* (2013.01); *B29C 70/025* (2013.01); *B29K 2995/0008* (2013.01); *C08J 2367/03* (2013.01); *C08K 2201/01* (2013.01)

(58) Field of Classification Search
CPC .............. C08J 3/203; C08K 9/02; C08K 3/36; C08K 3/08; C08L 67/03
USPC .................................. 428/403–407
See application file for complete search history.

(56) References Cited

U.S. PATENT DOCUMENTS

| | | | |
|---|---|---|---|
| 4,983,231 A | 1/1991 | Yamanaka et al. | |
| 5,051,200 A | 9/1991 | Srail et al. | |
| 6,962,753 B1 | 11/2005 | Yoshida et al. | |
| 2002/0121626 A1* | 9/2002 | Nagashima | C08G 63/80 252/299.01 |
| 2003/0010408 A1* | 1/2003 | Hosoe | H01Q 17/004 148/310 |
| 2003/0190498 A1* | 10/2003 | Fujieda | H01L 23/552 428/8 |
| 2003/0219598 A1 | 11/2003 | Sakurai | |
| 2009/0004475 A1* | 1/2009 | Sadaka | H01F 1/24 428/403 |
| 2010/0022764 A1* | 1/2010 | Otoshi | B29C 55/143 536/68 |

FOREIGN PATENT DOCUMENTS

| | | |
|---|---|---|
| CN | 1179619 C | 12/2004 |
| JP | 61-69866 A | 4/1986 |
| JP | 2001-237591 A | 8/2001 |
| JP | 2002-146003 A | 5/2002 |
| JP | 2009-155545 A | 7/2009 |

OTHER PUBLICATIONS

Machine translation of JP 2001-237591 A.
Communication from the Taiwan Patent Office issued Dec. 15, 2014 in a counterpart Taiwanese Application No. 100110717.

* cited by examiner

*Primary Examiner* — Wenwen Cai
(74) *Attorney, Agent, or Firm* — Sughrue Mion, PLLC

(57) ABSTRACT

A method for producing a liquid-crystalline polymer composition containing a liquid-crystalline polymer and a magnetic filler formed by heat-treating a composite material of a ceramic powder and a soft magnetic metal powder in an inert gas atmosphere.

11 Claims, No Drawings

METHOD OF PRODUCING A LIQUID-CRYSTALLINE POLYMER COMPOSITION AND MOLDED ARTICLE THEREOF

CROSS REFERENCE TO RELATED APPLICATIONS

This application is a continuation of pending U.S. patent application Ser. No. 13/071,919, filed Mar. 25, 2011, which claims priority to Japanese Patent Application No. P2010-081655, filed Mar. 31, 2010, the contents of all of which are incorporated herein by reference.

BACKGROUND OF THE INVENTION

Field of the Invention

The present invention relates to a liquid-crystalline polymer composition having an electromagnetic shielding property and an electric insulation property, and to a molded article thereof.

Related Background Art

Recently, according to the trend toward higher performance of electric and electronic equipment, for example, telecommunications equipment such as a portable telephone, and office automation (OA) apparatuses such as personal computer, the operating frequency thereof has become higher frequency. On the other hand, since electric and electronic equipment working at an operating frequency in high frequencies has electric and electronic components such as a processor and a communication cable easily radiating electromagnetic waves of high frequency, there is a problem that malfunction may easily occur due to the electromagnetic waves. Furthermore, the electromagnetic wave may cause malfunction in neighboring other electric and electronic equipment, and there is a concern that the electromagnetic wave may affect human bodies. Therefore, electric and electronic components easily radiating electromagnetic waves of high frequency are provided with an enclosure made of electromagnetic shielding materials.

The electromagnetic shielding materials include insulating materials attenuating electromagnetic waves by absorption and conductive materials reflecting electromagnetic waves, but the former materials are preferable from the viewpoint of preventing malfunction of electric and electronic equipment due to reflected electromagnetic waves. Thus, as the electromagnetic shielding materials, insulating resin compositions containing a resin and a magnetic filler are investigated, and among them, a liquid-crystalline polymer composition containing a liquid-crystalline polymer and a magnetic filler is preferably investigated because the liquid-crystalline polymer composition has excellent melting fluidity, is easily molded, and has high heat resistance and mechanical strength. For example, Japanese Patent Application Laid-Open Publication No. 2001-237591 discloses a liquid-crystalline polymer composition containing a liquid-crystalline polymer and a coupling-treated soft magnetic powder.

SUMMARY OF THE INVENTION

However, a conventional liquid-crystalline polymer composition containing a liquid-crystalline polymer and a magnetic filler is not necessarily sufficient in an electromagnetic shielding property and an insulating property. Furthermore, in molding of a liquid-crystalline polymer composition, it is advantageous in terms of the operability that the liquid-crystalline polymer composition is granulated into pellets in advance, and the pellets are molded, but in a conventional liquid-crystalline polymer composition containing a liquid-crystalline polymer and a magnetic filler, a strand is easily cut at the time of granulation, thus making the granulation difficult. Then, an object of the present invention is to provide a liquid-crystalline polymer composition containing a liquid-crystalline polymer and a magnetic filler, having excellent electromagnetic shielding property and insulating property, and being easily granulated.

In order to achieve the above object, the present invention provides a liquid-crystalline polymer composition containing a liquid-crystalline polymer and a magnetic filler obtained by heat-treating a composite material containing a ceramic powder and a soft magnetic metal powder in an inert gas atmosphere. Furthermore, the present invention also provides a molded article formed by molding this liquid-crystalline polymer composition.

Since the liquid-crystalline polymer composition of the present invention has excellent electromagnetic shielding property and insulating property and is easily granulated, a molded article having excellent electromagnetic shielding property and insulating property can be advantageously produced by molding the liquid-crystalline polymer composition.

DESCRIPTION OF THE PREFERRED EMBODIMENTS

A liquid-crystalline polymer used in the present invention is a polymer showing an optical anisotropy at the time of melting and forming an anisotropic melt at a temperature of 450° C. or less. The optical anisotropy can be confirmed by a usual polarization examination method using an orthogonal polarizer. The liquid-crystalline polymer has a long narrow and flat molecular shape and has a molecular chain having high rigidity, that is, a so-called mesogenic group, along the long chain of the molecule, in which either or both of a polymer main chain and a side chain may contain such a mesogenic group, but when the resultant molded article is required to have higher heat resistance, it is preferable that the polymer main chain has the mesogenic group.

Examples of the liquid-crystalline polymer include liquid-crystalline polyesters, liquid-crystalline polyesteramides, liquid-crystalline polyesterethers, liquid-crystalline polyester carbonates, liquid-crystalline polyesteramides, liquid-crystalline polyamides, and the like; among them, liquid-crystalline polyesters, liquid-crystalline polyesteramides, and liquid-crystalline polyamides are preferable because a molded article having more excellent strength is obtained; liquid-crystalline polyesters and liquid-crystalline polyesteramides are preferable because a less water-absorptive molded article is obtained; and fully aromatic liquid-crystalline polyesters are particularly preferable.

Preferable examples of the liquid-crystalline polymer include liquid-crystalline polyesters shown in the below-mentioned (A1) to (A8), and two or more of them can be used in combination if necessary.

(A1): Liquid-crystalline polyesters having a repeating unit represented by formula (i).

(A2): Liquid-crystalline polyesters having a repeating unit represented by formula (ii) and a repeating unit represented by formula (iii).

(A3): Liquid-crystalline polyesters having the repeating unit represented by formula (i), the repeating unit represented by formula (ii) and the repeating unit represented by formula (iii).

(A4): Liquid-crystalline polyesteramides or liquid-crystalline polyamides in which a part or all of the repeating unit represented by formula (i) is replaced by a repeating unit represented by formula (iv) in the (A1).

(A5): Liquid-crystalline polyesteramides or liquid-crystalline polyamides in which a part or all of the repeating unit represented by formula (iii) is replaced by a repeating unit represented by formula (v) and/or a repeating unit represented by formula (vi) in the (A2).

(A6): Liquid-crystalline polyesteramides in which a part or all of the repeating unit represented by formula (i) is replaced by the repeating unit represented by formula (iv) in the (A3).

(A7): Liquid-crystalline polyesteramides in which a part or all of the repeating unit represented by formula (iii) is replaced by the repeating unit represented by formula (v) and/or the repeating unit represented by formula (vi) in the (A3).

(A8): Liquid-crystalline polyesteramides or liquid-crystalline polyamides in which a part or all of the repeating unit represented by formula (i) is replaced by the repeating unit represented by formula (iv), and a part or all of the repeating unit represented by formula (iii) is replaced by the repeating unit represented by formula (v) and/or the repeating unit represented by formula (vi) in the (A3).

—O—Ar$^1$—CO—    (i)

—CO—Ar$^2$—CO—    (ii)

—O—Ar$^3$—O—    (iii)

—NH—Ar$^4$—CO—    (iv)

—O—Ar$^5$—NH—    (v)

—NH—Ar$^6$—NH—    (vi)

(In the formulae, Ar$^1$ and Ar$^4$ each independently represent a 1,4-phenylene group, a 2,6-naphthalenediyl group or a 4,4'-biphenylylene group. Ar$^2$, Ar$^3$, Ar$^5$ and Ar$^6$ each independently represent a 1,4-phenylene group, a 2,6-naphthalenediyl group, a 1,3-phenylene group or a 4,4'-biphenylylene group. Furthermore, a hydrogen atom present in the group represented by Ar$^1$, Ar$^2$, Ar$^3$, Ar$^4$, Ar$^5$ or Ar$^6$ may each independently be replaced by a halogen atom, an alkyl group or an aryl group.)

The repeating unit (i) is a repeating unit derived from an aromatic hydroxy carboxylic acid. Examples of the aromatic hydroxy carboxylic acid include 4-hydroxybenzoic acid, 6-hydroxy-2-naphthoic acid, 4'-hydroxy biphenyl-4-carboxylic acid, and aromatic hydroxy carboxylic acids in which a part or all of hydrogen atoms on the aromatic ring present in these aromatic hydroxy carboxylic acids are replaced by an alkyl group, an aryl group or a halogen atom.

The repeating unit (ii) is a repeating unit derived from an aromatic dicarboxylic acid. Examples of the aromatic dicarboxylic acid include terephthalic acid, 2,6-naphthalene dicarboxylic acid, isophthalic acid, 4,4'-diphenyl dicarboxylic acid, and aromatic dicarboxylic acids in which a part or all of hydrogen atoms on the aromatic ring present in these aromatic dicarboxylic acids are replaced by an alkyl group, an aryl group or a halogen atom.

The repeating unit (iii) is a repeating unit derived from an aromatic diol. Examples of the aromatic diol include hydroquinone, naphthalene-2,6-diol, resorcin, 4,4'-biphenylenediol, and aromatic diols in which a part or all of hydrogen atoms on the aromatic ring present in these aromatic diols are replaced by an alkyl group, an aryl group or a halogen atom.

The repeating unit (iv) is a repeating unit derived from an aromatic aminocarboxylic acid. Examples of the aromatic aminocarboxylic acid include 4-aminobenzoic acid, 6-amino-2-naphthoic acid, 4'-amino biphenyl-4-carboxylic acid, and aromatic aminocarboxylic acids in which a part or all of hydrogen atoms on the aromatic ring present in these aromatic aminocarboxylic acids are replaced by an alkyl group, an aryl group or a halogen atom.

The repeating unit (v) is a repeating unit derived from an aromatic amine having a hydroxyl group. Examples of the aromatic amine having a hydroxyl group include 4-amino phenol, 6-amino-2-naphthol, 3-amino phenol, 4-amino-4'-hydroxy diphenyl, and aromatic hydroxy amines in which a part or all of hydrogen atoms on the aromatic ring present in these aromatic amines having a hydroxyl group are replaced by an alkyl group, an aryl group or a halogen atom.

The repeating unit (vi) is a repeating unit derived from an aromatic diamine. Examples of the aromatic diamine include 1,4-phenylenediamine, 2,6-naphthalene diamine, 1,3-phenylenediamine, 4,4'-biphenylylene diamine, and aromatic diamines in which a part or all of hydrogen atoms on the aromatic ring present in these aromatic diamines are replaced by an alkyl group, an aryl group or a halogen atom.

Examples of substituents that the repeating units (i) to (vi) have, include as an alkyl group a methyl group, an ethyl group, a propyl group, an isopropyl group, a butyl group, a tert-butyl group, a hexyl group, a cyclohexyl group, an octyl group, and a decyl group, and the alkyl group has usually 1 to 10 carbon atoms, may be linear or branched, or may be alicyclic. Furthermore, examples of the aryl group include a phenyl group, and a naphthyl group, and the aryl group has usually 6 to 10 carbon atoms. Furthermore, examples of the halogen atom include a fluorine atom, a chlorine atom, a bromine atom, and an iodine atom.

In the above-mentioned liquid-crystalline polymers, the liquid-crystalline polyester selected from the group consisting of (A1) to (A3) is preferable from the viewpoint of obtaining a molded article having more excellent heat resistance and dimension stability; the liquid-crystalline polyester of (A1) or (A3) is more preferable; and the liquid-crystalline polyester of (A3) is further preferable.

As mentioned above, the liquid-crystalline polyester of (A1) has a repeating unit (i), and preferably has a plurality of types of repeating units (i). The reason therefor is because it has an excellent balance between the heat resistance and the molding processing property.

The liquid-crystalline polyester of (A3) has the repeating unit (i), the repeating unit (ii) and the repeating unit (iii), and when the total thereof is 100 mol %, it is preferable that the content of the repeating unit (i) is 30 to 80 mol %, the content of the repeating unit (ii) is 10 to 35 mol %, and the content of the repeating unit (iii) is 10 to 35 mol %. Note here that the molar ratio of the repeating unit (ii) to the repeating unit (iii), when represented by the repeating unit (ii)/the repeating unit (iii), is preferably 0.9/1.0 to 1.0/0.9, and it is advantageous that the ratio is 1.0/1.0, that is, substantially the equimolar ratio, because, in producing a liquid-crystalline polyester, the numbers of carboxyl groups and hydroxyl groups, capable of forming an ester bond are the same, so that the molecular weight of the resultant liquid-crystalline polyester can be increased, and thus a molded article having more excellent heat resistance can be obtained.

Herein, when the content of the repeating unit (i) is too small and the content of the repeating unit (ii) and/or the repeating unit (iii) is too large, it tends to be difficult for the obtained polyester to exhibit the liquid-crystalline property. On the other hand, when the content of the repeating unit (i) is too large and the content of the repeating unit (ii) and/or the repeating unit (iii) is too small, it is difficult for the obtained liquid-crystalline polyester to be melted, and thus the moldability tends to be deteriorated.

The content of the repeating unit (i) is more preferably 40 to 70 mol %, and further preferably 45 to 65 mol %. Furthermore, the contents of the repeating unit (ii) and the repeating unit (iii) are more preferably 15 to 30 mol % respectively, and further preferably 17.5 to 27.5 mol %, respectively.

The liquid-crystalline polyester of (A1) or (A3) can be obtained by polymerizing a raw material monomer deriving the liquid-crystalline polyester, that is, a plurality of types of aromatic hydroxy carboxylic acids, or aromatic hydroxy carboxylic acid, aromatic dicarboxylic acid and aromatic diol by well-known means. Among them, in the aspect of the ease in producing a liquid-crystalline polyester, it is preferable that a raw material monomer is previously converted into an ester-forming derivative, followed by producing a liquid-crystalline polyester.

Herein, the ester-forming derivatives are derivatives having a group for promoting an ester formation reaction, and in the case of a raw material monomer having a carboxyl group in the molecule, examples of the ester-forming derivatives include a derivative in which the carboxyl group is converted into a haloformyl group or an acyloxycarbonyl group, and a derivative in which the carboxyl group is converted into an alkoxycarbonyl group with lower alcohol. Furthermore, in the case of a raw material monomer having a hydroxyl group in the molecule, examples of the ester-forming derivatives include a derivative in which the hydroxyl group is converted into an acyloxy group with a lower carboxylic acid.

A particularly preferable method of producing a liquid-crystalline polyester using such ester-forming derivatives is a method using ester-forming derivatives in which a hydroxyl group of an aromatic hydroxy carboxylic acid and an aromatic diol is converted into an acyloxy group with a lower carboxylic acid. This acylation is usually carried out by allowing a compound having a hydroxyl group to react with acetic anhydride. A liquid-crystalline polyester can be obtained by subjecting such a ester-forming derivative to deacetation polymerization with an aromatic dicarboxylic acid.

Examples of the method of producing a liquid-crystalline polyester using the ester-forming derivative may include a method described in Japanese Patent Application Laid-Open Publication No. S61-69866 as a method of producing the liquid-crystalline polyester of (A1), and a method described in Japanese Patent Application Laid-Open Publication No. 2002-146003 as a method of producing the liquid-crystalline polyester of (A3). That is to say, monomers corresponding to the repeating unit (i), the repeating unit (ii) and the repeating unit (iii) are mixed with each other and acylated with acetic anhydride so as to form ester-forming derivatives, then a raw material monomer containing the ester-forming derivatives is melt-polymerized, and thus the liquid-crystalline polyester can be obtained.

Herein, when a molded article having more excellent heat resistance is intended, it is preferable that the liquid-crystalline polyester obtained by the melt polymerization is used as a prepolymer and the molecular weight of the prepolymer is further increased, and it is advantageous that such increasing of the molecular weight of the prepolymer is carried out by employing solid phase polymerization. This solid phase polymerization can be carried out by pulverizing the prepolymer into powder and heating the powder. With this solid phase polymerization, polymerization further proceeds, so that a higher molecular weight can be achieved.

When the prepolymer is made into powder, for example, the prepolymer may be pulverized after it is cooled and solidified. The average particle size of the powder obtained by pulverizing is preferably 0.05 to 3 mm, and more preferably 0.05 to 1.5 mm because an increase in the molecular weight of the liquid-crystalline polyester is further promoted. It is furthermore preferable that the average particle size is 0.1 to 1.0 mm because sintering between particles does not occur, so that the operability of the solid phase polymerization tends to be improved, and thus the molecular weight of the liquid crystal polyester is efficiently increased. Note here that the average particle size of the prepolymer can be determined by external observation and the like.

In the preferable solid phase polymerization, firstly, the temperature is raised from room temperature to a temperature at least 20° C. lower than the flow starting temperature of the prepolymer. The temperature rising time at this time is preferably within 1 hour from the viewpoint of reducing the reaction time. Next, the temperature is raised from the temperature at least 20° C. lower than the flow starting temperature of the prepolymer to a temperature of 280° C. or higher. The temperature is raised preferably at a temperature-rising rate of 0.3° C./min or less, and more preferably at 0.1 to 0.15° C./min. The temperature-rising rate of 0.3° C./min or less makes it difficult for the sintering between particles of the powder to occur, and thus, makes it possible to produce liquid-crystalline polyester having a higher molecular weight.

Furthermore, in order to increase the molecular weight of the liquid-crystalline polyester, it is preferable that the reaction is carried out usually at 280° C. or higher, and preferably at 280° C. to 400° C. for 30 minutes or more in the final process of the solid phase polymerization. In particular, from the viewpoint of improving the heat stability of a liquid-crystalline polyester, it is preferable that the reaction is carried out at 280° C. to 350° C. for 30 minutes to 30 hours, and more preferably at 285° C. to 340° C. for 30 minutes to 20 hours. Such heating conditions can be appropriately optimized according to the types of raw material monomers used in production of the liquid-crystalline polyester.

The liquid-crystalline polyester of (A3) obtained by carrying out the solid phase polymerization achieves a sufficiently high molecular weight, so that a molded article having excellent heat resistance can be obtained. The liquid-crystalline polyester has a flow starting temperature of preferably 250° C. or higher, and more preferably 280° C. to 390° C.

Note here that the flow starting temperature means a temperature at which the melt viscosity, measured by using a capillary rheometer equipped with a die having an inner diameter of 1 mm and a length of 10 mm when the liquid-crystalline polyester is extruded from a nozzle under the load of 9.8 MPa (100 kg/cm$^2$) at temperature-rising rate of 4° C./min, is 4800 Pa·s (48,000 poise), and the flow starting temperature is an index expressing a molecular weight of liquid-crystalline polyester well known in the art (see, edited by Naoyuki Koide, "Synthesis, Molding, and Application of Liquid-Crystalline Polymer" pp. 95-105, CMC Publishing CO., LTD. published Jun. 5, 1987). As a device for measuring the flow starting temperature, for example, a flowing property evaluation device, "Flow Tester CFT-500D" manufactured by Shimadzu Corporation is used.

The liquid-crystalline polyester of (A1) or (A3) is described above as a particularly preferable liquid-crystalline polymer, but other liquid-crystalline polymers, for example, the liquid-crystalline polyesters of (A2), and (A4) to (A8) can be easily produced by the production method using the above-mentioned ester-forming derivatives.

The liquid-crystalline polymer composition of the present invention contains a liquid-crystalline polymer as mentioned above and a magnetic filler formed by heat-treating a composite material (composite) of a ceramic powder and a soft magnetic metal powder in an inert gas atmosphere. Thus, by blending the predetermined magnetic filler with the liquid-crystalline polymer, it is possible to obtain a liquid-crystalline polymer composition having excellent electromagnetic shielding property and insulating property and being granulated easily.

The volume average particle size of the magnetic filler is preferably 1 to 100 μm, and more preferably 10 to 50 μm from the viewpoint of dispersibility with respect to a liquid-crystalline polymer.

The soft magnetic metal powder is a powder containing a metal (soft magnetic metal) having a small coercive force and large magnetic permeability, and the magnetic permeability of the soft magnetic metal, when it is represented by relative magnetic permeability divided by the magnetic permeability in vacuum, is preferably 100 or more, and more preferably 200 or more. Herein, the soft magnetic metal having the relative magnetic permeability of 100 or more can be selected from the metals described in, for example, Chronological Scientific Tables (RIKOH TOSHO) and Noriyuki Nanba and Fumitaka Kaneko "Electric materials—Dielectric materials and Magnetic materials—" p. 208 (RI-KOH TOSHO, published in March, 1980), and the soft magnetic metal is preferably cobalt, iron or nickel, and more preferably iron or nickel.

Furthermore, the soft magnetic metal powder may be a powder containing an alloy of soft magnetic metals, and examples of the alloy include an Fe—Si alloy (silicon steel), an Fe—Al alloy (alperm), an Fe—Ni alloy (permalloy), an Fe—Co alloy, an Fe—V alloy (Permendur), an Fe—Cr alloy, an Fe—Si alloy (silicon steel), an Fe—Al—Si alloy, an Fe—Cr—Al alloy, an Fe—Cu—Nb—Si—B alloy, and an Fe—Ni—Cr alloy referred to as Mu metal, and preferably, these alloys also have relative magnetic permeability of 100 or more.

These soft magnetic metals or alloys thereof can be granulated into a soft magnetic metal powder by using appropriate crusher or classifier.

The soft magnetic metal powder preferably contains iron or an alloy thereof as a main component, and the proportion of the iron or the alloy thereof in the soft magnetic metal powder is usually 50 to 100 mass % and preferably 80 to 100 mass %. The soft magnetic metals powder having such materials is preferable because they have particularly high relative magnetic permeability, so that the electromagnetic shielding property of the obtained molded article becomes better. Also, it can be said that it is advantageous from the viewpoint of cost efficiency.

The aspect ratio of the soft magnetic metal powder is preferably 2 or more. The aspect ratio herein denotes a value obtained by externally observing the soft magnetic metal powder by magnifying them by about 100 to 300 times by using a scanning electron microscope or an optical microscope, calculating the ratio (L/S) of the longest diameter (major axis L) with respect to the shortest diameter (minor axis S) of each particle of about 100 particles, and number-averaging them. It is preferable that the aspect ratio of the soft magnetic metal powder is 2 or more because when the liquid-crystalline polymer composition is melt-molded, the major axis of the magnetic filler is easily oriented in the flowing direction (MD), so that when a plane parallel to the MD is defined as an electromagnetic wave shield plane, the area ratio of the magnetic filler occupied in the plane is easily increased, and the electromagnetic shielding performance of the magnetic filler can be effectively used. From this point, the aspect ratio of the soft magnetic metal powder is more preferably 2.5 or more.

It is preferable that the ceramic powder contains silicon oxide as a main component, and it may contain other components, for example, silicon nitride and silicon carbide, and may contain an organic group. The proportion of silicon oxide in the ceramic powder is usually 50 to 100 mass %, and preferably 80 to 100 mass %.

As the ceramic powder containing such a silicon oxide as a main component, various substances generally referred to as silica are commercially available. Such commercially available silica is classified into natural silica and synthetic silica (artificial silica), and the synthetic silica includes dry synthetic silica and wet synthetic silica. As the natural silica, silica obtained by pulverizing quartz is preferable because purity of silicon oxide is high; and natural silica produced by combining pulverizing and melting quartz is also preferable because it has high purity of silicon oxide. Examples of the dry synthetic silica include silica obtained by firing a mixture of silicon tetrachloride and hydrogen at about 1000 to 1200° C. in the air, and silica obtained by melting metal silicon and spraying it into the air via a nozzle. The dry synthetic silica obtained by such a production method may contain a small amount of a Si—H bond in silica. Ceramic powder containing such a small amount of a Si—H bond may be used. Furthermore, examples of the wet synthetic silica include silica obtained by hydrolyzing silicon tetrachloride and alkoxide silicate. The wet synthetic silica obtained in such a production method may contain organic matters and chlorine as reaction impurities, and may contain a silanol group (Si—OH) in a molecule. Furthermore, such a silanol group may be hydrated so that silica contains hydrated water. As the ceramic powder, such wet synthetic silica can be used, but it is preferable to use wet synthetic silica obtained by treating the above-mentioned wet synthetic silica at high temperatures of about 800° C. to remove hydrated water or organic matters. Such silica is available from, for example, Admatechs Company Limited, TOSOH SILICA CORPORATION, and preferably used as raw materials of the above-mentioned composite material.

The composite material can be obtained by mixing ceramic powder and soft magnetic metal powder by using a mixer capable of dry-mixing them, for example, a ball mill, a planetary ball mill, a sand mill and the like. At this time, when a planetary ball mill is used as a mixer, a composite material formed by coating a soft magnetic metal powder with a ceramic powder can be advantageously used, and by using the magnetic filler obtained from such a composite material, an electric insulation property of a molded article obtained from the liquid-crystalline polymer composition tends to be further preferable. From such a viewpoint, it is preferable that the ratio of the soft magnetic metal powder and the ceramic powder to be used is selected so that the ceramic powder coats the soft magnetic metal powder. The mass ratio to be used may be obtained by carrying out the preliminary experiments in several points to which the ratios of the soft magnetic metal powder and the ceramic powder to be used are assigned, observing a cross section of the composite material obtained by the preliminary experiment by using, for example, a scanning electron microscope (SEM), and determining a coating state of the ceramic powder. Furthermore, it is preferable that the soft magnetic metal powder and the ceramic powder are mixed in an inert gas atmosphere such as nitrogen and argon in order to prevent the soft magnetic metal powder from being remarkably oxidized.

Furthermore, as the composite material formed by coating soft magnetic metal powder with ceramic powder, composite material, for example, a composite material formed by coating iron powder with silica particles is available from Hitachi High-Technologies Corporation. This composite material manufactured by Hitachi High-Technologies Corporation is described in the document (Electronic Materials, September 2008).

Note here that in the composite material formed by coating soft magnetic metal powder with ceramic powder, the ceramic powder may coats a part of the surface of the soft magnetic metal powder, and it is not necessarily coats the entire surface of the soft magnetic metal powder.

The magnetic filler is obtained by heat-treating the above-mentioned composite material in an inert gas atmosphere such as nitrogen and argon. Herein, the heat-treatment temperature is preferably 800° C. or higher, and more preferably 900° C. or higher. Furthermore, the heat-treatment time is preferably 5 hours or longer, and more preferably 12 hours or longer.

The liquid-crystalline polymer composition of the present invention may contain components other than the liquid-crystalline polymer and the magnetic filler, if necessary, and examples of such materials include fibrous reinforcing materials such as glass fiber, silica-alumina fiber, alumina fiber, and carbon fiber; needle-like reinforcing materials such as aluminum borate whisker and potassium titanate whisker; inorganic fillers such as glass beads, talc, mica, graphite, wollastonite, and dolomite; mold release improving agents such as a fluorocarbon resin, and metallic soap; coloring agents such as dyestuffs and pigments; antioxidants; thermal stabilizers; ultraviolet absorbers; surfactants, and the like, and two or more thereof may be used together if necessary. Furthermore, additives having an outer lubricant effect such as higher fatty acids, higher fatty acid esters, higher fatty acid metal salts, and fluorocarbon surfactants can be used. In addition, a small amount of a thermoplastic resin other than the liquid-crystalline polymer, for example, polyamide, crystalline polyester, polyphenylene sulfide, polyether ketone, polycarbonate, polyphenylene ether and a denatured product thereof, polysulfone, polyethersulfon, polyetherimide, and the like; and a thermosetting resin, for example, a phenol resin, and an epoxy resin may be contained.

In the liquid-crystalline polymer composition of the present invention, the content of the magnetic filler is preferably equal to or higher than the mass of the liquid-crystalline polymer. Specifically, the content of the magnetic filler is preferably 100 to 450 parts by mass, more preferably 100 to 300 parts by mass, and further preferably 120 to 250 parts by mass, with respect to 100 parts by mass of liquid-crystalline polymer. It is advantageous that the content of the magnetic filler with respect to the liquid-crystalline polymer is within this range because the electromagnetic shielding effect and mold processing property are well balanced. Note here that when a plurality of types of magnetic filler is used as the magnetic filler, the total amount is made to be within the above-mentioned range; and similarly, when a plurality of types of liquid-crystalline polymers are used, the total amount is made to be within the above-mentioned range.

The liquid-crystalline polymer composition of the present invention can be obtained by mixing the liquid-crystalline polymer and the magnetic filler by various well-known means, but it is preferable that the liquid-crystalline polymer composition is obtained by melt-kneading the liquid-crystalline polymer and the magnetic filler from the viewpoint of low cost, and it is more preferable that it is obtained in a form of pellets by melt-kneading extrusion.

A typical melt-kneading extruder used for melt-kneading extrusion is equipped with a cylinder having a heater, and a screw for extruding a hot melt into the cylinder; and it may be a single-screw kneading extruder provided with one screw in a cylinder so that it is driven to be rotated or may be a twin-screw kneading extruder provided with two screws in a cylinder so that they are driven to be rotated in the different directions or in the same direction, but the use of the twin-screw kneading extruder is advantageous for the liquid-crystalline polymer composition of the present invention.

In the melt-kneading extruder, it is preferable that the ratio (L/D) of the effective length (L) of the screw to the diameter (D) of the screw is 20 or more (L and D are the same scale unit) because the magnetic filler is dispersed more uniformly in the liquid-crystalline polymer. Herein, the effective length of the screw denotes a length of the screw in the axial direction and the diameter of the screw denotes a nominal outer diameter dimension of the screw.

Furthermore, it is preferable that this melt-kneading extruder has a plurality of supply ports. In order to form a hot melt from the liquid-crystalline polymer and the magnetic filler and to obtain pellets of the liquid-crystalline polymer composition of the present invention, firstly, to the melt-kneading extruder from an upstream-side supply port provided in the upstream-side in the extrusion direction of the melt-kneading extruder, 50 mass % or more of the total supplied amount of the liquid-crystalline polymer is supplied and 50 mass % or less of the total supplied amount of the magnetic filler is supplied. Then, the remaining amount of the liquid-crystalline polymer ([the total supplied amount of the liquid-crystalline polymer]—[the supplied amount of the liquid-crystalline polymer supplied from the upstream-side supply port]) and the remaining amount of the magnetic filler ([the total supplied amount of the magnetic filler]—[the supplied amount of the magnetic filler supplied from the upstream-side supply port]) are supplied to the melt-kneading extruder from the downstream-side supply port provided in the downstream side in the extrusion direction than the upstream-side supply port. Thus, for the hot melt, a contact time between the liquid-crystalline polymer and the magnetic filler can be relatively short, and thus the deterioration of the liquid-crystalline polymer tends to be suppressed, and therefore it is advantageous in production of the liquid-crystalline polymer composition of the present invention. In this point, it is preferable that the supplied amount of the liquid-crystalline polymer from the upstream-side supply port is 60 mass % or more with respect to the total supplied amount. Furthermore, it is preferable that the supplied amount of the magnetic filler from the upstream-side supply port is 20 mass % or less with respect to the total supplied amount. Note here that when the components other than the liquid-crystalline polymer and the magnetic filler as mentioned above are contained in the liquid-crystalline polymer composition of the present invention, such components are preferably supplied from the downstream side supply port together with the magnetic filler.

Examples of the method of forming the thus obtained liquid-crystalline polymer composition of the present invention include injection molding, extrusion molding, transfer molding, blow molding, press molding, injection press molding, and extrusion injection molding, and two or more thereof may be employed in combination if necessary. Among them, for producing electric and electronic components used in electric and electronic equipment, melt molding such as injection molding and extrusion injection molding is preferable and injection molding is more preferable.

The injection molding can be carried out by melting the liquid-crystalline polymer composition of the present invention, heating the melted liquid-crystalline polymer composition to an appropriate temperature, and injecting it into a mold having a desired cavity shape by using an injection molding machine (for example, "Hydraulic Horizontal Molding Machine PS40E5ASE" manufactured by Nissei Plastic Industrial Co., Ltd.). The temperature at which the liquid-crystalline polymer composition is heat and melted for injection is preferably Tp'+10 (° C.) or higher and Tp'+50 (° C.) or lower when the flow starting temperature Tp' (° C.) of the liquid-crystalline polymer composition to be used is defined as a basic point. Furthermore, the temperature of the mold is usually selected from the range between room temperature and 180 (° C.) from the viewpoint of the cooling rate and the productivity of the liquid-crystalline polymer composition.

It is preferable that the thus obtained molded article has a volume resistivity value of $10^6$ Ωm more. Furthermore, the electromagnetic shielding property is preferably 1 dB or more when it is expressed by an attenuation effect with respect to high frequency of 2.5 GHz.

It is preferable that the thus obtained molded article can be applied for various applications of use, and, in particular, it is preferably used as surface mounting components by taking use of the electric insulation property and the electromagnetic shielding property. Examples of such surface mounting component include a housing, a choke coil, a connector, and the like, of electric and electronic components. The molded article formed by molding the liquid-crystalline polymer composition of the present invention is used as surface mounting components extremely advantageously because an effect of absorbing an electromagnetic wave noise can be expected.

EXAMPLE

Examples 1 to 5 and Comparative Example 1

Production of Liquid-Crystalline Polymer

In a reactor equipped with a stirring device, a torque meter, a nitrogen gas inlet tube, a thermometer, and a reflux cooler, 994.5 g (7.2 moles) of p-hydroxybenzoic acid, 446.9 g (2.4 moles) of 4,4'-dihydroxybiphenyl, 299.0 g (1.8 moles) of terephthalic acid, 99.7 g (0.6 moles) of isophthalic acid, and 1347.6 g (13.2 moles) of acetic anhydride were charged; the inside of the reactor was fully replaced with nitrogen gas, the temperature was then raised to 150° C. over 30 minutes under nitrogen gas stream, and reflux was carried out for 3 hours with the temperature kept. Then, the temperature was raised to 320° C. over 2 hours and 50 minutes while distillate acetic acid generated as a by-product and unreacted acetic acid anhydride were distilled away; the content was extracted from the reactor at the time when the increase of torque was observed, and the content was cooled to room temperature and then pulverized into powder by using a coarse crusher. The temperature of the powder was raised from room temperature to 250° C. over 1 hour in a nitrogen atmosphere, and raised from 250° C. to 285° C. over 5 hours, and kept at this temperature for 3 hours; thereby carrying out solid phase polymerization and then cooling thereof to obtain a liquid-crystalline polymer. The flow starting temperature of this liquid-crystalline polymer was 327° C.

[Heat Treatment of Composite Material (Preparation of Magnetic Filler)]

An electromagnetic wave absorption filler (manufactured by Hitachi High-Technologies Corporation, volume average particle size: 20 μm, aspect ratio: 2.7) as a composite material formed by coating iron powder with silica particles was charged in a crucible, which was placed in an electric furnace, and heat-treated in a nitrogen atmosphere at temperatures and for periods of time shown in Table 1 so as to obtain magnetic filler.

[Production and Molding of Liquid-Crystalline Polymer Composition]

A liquid-crystalline polymer and a magnetic filler were kneaded at the ratio shown in Table 1 at 330° C. by using a unidirectional twin-screw extruder ("PCM-30HS" manufactured by Ikegai Iron Works Ltd.), extruded into strands at the rate of 10 kg/h, cut and granulated to obtain a pellet-shaped liquid-crystalline polymer composition. At that time, 70 mass % of the total supply amount of the liquid-crystalline polymer was supplied from the upstream-side supply port of the extruder; and 30 mass % of the total supply amount of the liquid-crystalline polymer and the total amount of the magnetic filler were supplied from the downstream-side supply port of the extruder. The obtained liquid-crystalline polymer was subjected to injection molding at a cylinder temperature of 340° C., a mold temperature of 130° C., and at the injection rate of 30 $cm^3$/s by using an injection molding machine ("PS40E5ASE" manufacture by Nissei Plastic Industrial Co., Ltd.) to obtain a molded article 1 (a molded article having a size of 64 mm×64 mm×1 mm). Furthermore, similarly, the injection molding was carried out to obtain a molded article 2 (ASTM, dumbbell No. 4).

[Evaluation of Granulation Property]

In the above-mentioned granulation, the number of occurrences of strand breakage during production of 1 kg of pellets was visually observed and evaluated according to the following 3 stages, and results are shown in Table 1.

A: zero, B: 1 to 4 times, C: 5 times or more.

[Measurement of Electromagnetic Wave Attenuation Effect]

The molded article 1 was used and measurement was carried out at frequency of 2.5 GHz by using a coaxial-tube type ("S-39D" manufactured by Keycom Corporation) in conformity with ASTM D4935.

[Measurement of Volume Resistivity]

The molded article 1 was used and measurement was carried out by using "SM-10E Super Insulation Meter" (manufactured by Toa Denpa Kogyo K.K.), in conformity with ASTM D257.

[Measurement of Tensile Strength]

The molded article 2 was used and measurement was carried out in conformity with ASTM D638.

TABLE 1

| | Example 1 | Example 2 | Example 3 | Example 4 | Example 5 | Comparative Example 1 |
|---|---|---|---|---|---|---|
| Liquid-crystalline polymer (part by mass) | 100 | 100 | 100 | 100 | 100 | 100 |
| Magnetic filler (part by mass) | 150 | 150 | 150 | 150 | 230 | 150 |
| Heat-treatment temperature (° C.) | 800 | 900 | 900 | 900 | 900 | Not heat-treated |
| Heat-treatment time (h) | 20 | 5 | 12 | 20 | 20 | |
| Granulation property | B | B | A | A | A | C |
| Electromagnetic wave attenuation effect (dB) 2.5 GHz | 1.4 | 2.0 | 1.5 | 2.0 | 3.0 | 2.0 |
| Volume resistivity value (Ωm) | $10^{13}$ | $10^{13}$ | $10^{13}$ | $10^{13}$ | $10^{13}$ | $10^{13}$ |
| Tensile strength (MPa) | 70 | 68 | 70 | 72 | 50 | 30 |

Examples 6 to 8

Production and Molding of Liquid-Crystalline Polymer Composition

A liquid-crystalline polymer and a magnetic filler were kneaded at the ratio shown in Table 2 at 355° C. by using a unidirectional twin-screw extruder ("PCM-30HS" manufactured by Ikegai Iron Works Ltd.), extruded into strands at the rate of 15 kg/h, cut and granulated to obtain a pellet-shaped liquid-crystalline polymer composition. At that time, 70 mass % of the total supply amount of the liquid-crystalline polymer was supplied from the upstream-side supply port of the extruder, and 30 mass % of the total supply amount of the liquid-crystalline polymer and the total amount of the magnetic filler were supplied from the downstream-side supply port of the extruder. The obtained liquid-crystalline polymer was subjected to injection molding at a cylinder temperature of 340° C., a mold temperature of 130° C., and at the injection rate of 30 cm³/s by using the injection molding machine ("PS40E5ASE" manufacture by Nissei Plastic Industrial Co., Ltd.) to obtain a molded article 1 (a molded article having a size of 64 mm×64 mm×1 mm). Furthermore, similarly, the injection molding was carried out to obtain a molded article 2 (ASTM, dumbbell No. 4).

[Evaluation of Granulation Property]

In the above-mentioned granulation, the number of occurrences of strand breakage during production of 1 kg of pellets was visually observed and evaluated according to the following three stages, and results are shown in Table 2. A: zero, B: 1 to 4 times, C: 5 times or more.

[Measurement of Electromagnetic Wave Attenuation Effect]

The molded article 1 was used and measurement was carried out at frequency of 2.5 GHz by using a coaxial-tube type ("S-39D" manufactured by Keycom Corporation) in conformity with ASTM D4935. Furthermore, the molded article 1 was used and measurement was carried out at frequency of 10 GHz by using a coaxial-tube type ("S-GPC7" manufactured by Keycom Corporation) in conformity with ASTMD4935.

[Measurement of Volume Resistivity]

The molded article 1 was used and measurement was carried out by using "SM-10E Super Insulation Meter" (manufactured by Toa Denpa Kogyo K.K.), in conformity with ASTM D257.

[Measurement of Tensile Strength]

The molded article 2 was used and measurement was carried out in conformity with ASTM D638.

TABLE 2

| | Example 6 | Example 7 | Example 8 |
|---|---|---|---|
| Liquid-crystalline polymer (part by mass) | 100 | 100 | 100 |
| Magnetic filler (part by mass) | 160 | 195 | 230 |
| Heat-treatment temperature (° C.) | 900 | 900 | 900 |
| Heat-treatment time (h) | 18 | 18 | 18 |
| Granulation property | A | A | A |
| Electromagnetic wave attenuation effect (dB) 2.5 GHz | 1.5 | 2.1 | 2.9 |
| Electromagnetic wave attenuation effect (dB) 10 GHz | 5.7 | 6.1 | 8.0 |
| Volume resistivity value (Ωm) | $10^{13}$ | $10^{13}$ | $10^{13}$ |
| Tensile strength (MPa) | 80 | 65 | 57 |

What is claimed is:

1. A method for producing a liquid-crystalline polymer composition comprising:
    heat-treating a composite material of a ceramic powder and a soft magnetic metal powder in an inert gas atmosphere at 800° C. or higher to obtain a magnetic filler; and
    blending the magnetic filler with a liquid-crystalline polymer obtained by heat-treating composite material in an inert gas atmosphere at 800° C.

2. The method according to claim 1, wherein the liquid-crystalline polymer is a fully aromatic liquid-crystalline polyester.

3. The method according to claim 1, wherein the liquid-crystalline polymer has a repeating unit represented by formula (i), a repeating unit represented by formula (ii) and a repeating unit represented by formula (iii):

—O—Ar¹—CO— (i)

—CO—Ar²—CO— (ii)

—O—Ar³—O— (iii)

wherein $Ar^1$ represents a 1,4-phenylene group, a 2,6-naphthalenediyl group or a 4,4'-biphenylylene group; $Ar^2$ and $Ar^3$ each independently represent a 1,4-phenylene group, a 2,6-naphthalenediyl group, a 1,3-phenylene group or a 4,4'-biphenylylene group; and a hydrogen atom present in the group represented by $Ar^1$, $Ar^2$, or $Ar^3$ may each independently be replaced by a halogen atom, an alkyl group or an aryl group.

4. The method according to claim 1, wherein the ceramic powder contains silicon oxide as a main component.

5. The method according to claim 1, wherein the soft magnetic metal powder contains iron or an iron alloy as a main component.

6. The method according to claim 1, wherein an aspect ratio of the soft magnetic metal powder is 2 or more.

7. The method according to claim 1, wherein the composite material is formed by coating the soft magnetic metal powder with the ceramic powder.

8. The method according to claim 1, wherein a blending content of the magnetic filler is 100 to 450 parts by mass with respect to 100 parts by mass of the liquid-crystalline polymer.

9. The method according to claim 1, wherein the step of blending the magnetic filler with the liquid-crystalline polymer comprising:

supplying the liquid-crystalline polymer and the magnetic filler to a melt-kneading extruder equipped with a screw having a ratio (L/D) of the effective length (L) of the screw to the diameter (D) of the screw of 20 or more, a first supply port, and a second supply port provided in the downstream side of the first supply port in the extrusion direction, such that 50 mass % or more of the total supply amount of the liquid-crystalline polymer and 50 mass % or less of the total supply amount of the magnetic filler are supplied from the first supply port and the remaining portion of the liquid-crystalline polymer and the remaining portion of the magnetic filler are supplied from the second supply port; and melt-kneading the supplied materials.

10. A method for producing a molded article comprising:
obtaining the liquid-crystalline polymer composition formed by the method according to claim 1; and
molding the liquid-crystalline polymer composition.

11. The method according to claim 10, wherein the volume resistivity value of the molded article is $10^6$ Ωm or more, and the attenuation effect of the molded article with respect to an electromagnetic wave at frequency 2.5 GHz is 1 dB or more.

* * * * *

UNITED STATES PATENT AND TRADEMARK OFFICE
CERTIFICATE OF CORRECTION

PATENT NO. : 9,538,694 B2
APPLICATION NO. : 14/262849
DATED : January 3, 2017
INVENTOR(S) : Shintaro Komatsu and Hiroshi Harada Page 1 of 1

It is certified that error appears in the above-identified patent and that said Letters Patent is hereby corrected as shown below:

In the Claims

Claim 1 should read:

1. A method for producing a liquid-crystalline polymer composition comprising:
heat-treating a composite material of a ceramic powder and a soft magnetic metal powder in an inert gas atmosphere at 800° C or higher to obtain a magnetic filler; and
blending the magnetic filler with a liquid-crystalline polymer.

Signed and Sealed this
Thirteenth Day of June, 2017

Joseph Matal
*Performing the Functions and Duties of the
Under Secretary of Commerce for Intellectual Property and
Director of the United States Patent and Trademark Office*